US010253425B2

(12) United States Patent
Takano

(10) Patent No.: US 10,253,425 B2
(45) Date of Patent: Apr. 9, 2019

(54) SINGLE-CRYSTAL PULLING APPARATUS AND SINGLE-CRYSTAL PULLING METHOD

(71) Applicant: SHIN-ETSU HANDOTAI CO., LTD., Tokyo (JP)

(72) Inventor: Kiyotaka Takano, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 15/758,023

(22) PCT Filed: Aug. 23, 2016

(86) PCT No.: PCT/JP2016/003827
§ 371 (c)(1),
(2) Date: Mar. 7, 2018

(87) PCT Pub. No.: WO2017/047008
PCT Pub. Date: Mar. 23, 2017

(65) Prior Publication Data
US 2018/0237940 A1   Aug. 23, 2018

(30) Foreign Application Priority Data
Sep. 18, 2015   (JP) .................. 2015-185654

(51) Int. Cl.
C30B 15/30   (2006.01)
C30B 15/00   (2006.01)
(Continued)

(52) U.S. Cl.
CPC ............ *C30B 15/305* (2013.01); *C30B 15/00* (2013.01); *C30B 15/14* (2013.01); *C30B 29/06* (2013.01);
(Continued)

(58) Field of Classification Search
CPC combination set(s) only.
See application file for complete search history.

(56) References Cited

U.S. PATENT DOCUMENTS

2004/0107894 A1   6/2004   Shimonosono et al.
2005/0166600 A1   8/2005   Mitsubori
(Continued)

FOREIGN PATENT DOCUMENTS

JP   2004-051475 A   2/2004
JP   2004-315289 A   11/2004
(Continued)

OTHER PUBLICATIONS

Mar. 20, 2018 International Preliminary Report on Patentability issued in International Patent Application No. PCT/JP2016/003827.
(Continued)

Primary Examiner — Erin F Bergner
(74) Attorney, Agent, or Firm — Oliff PLC

(57) ABSTRACT

A single-crystal pulling apparatus including a pulling furnace containing a crucible containing molten single crystal material, and a magnetic field generation device that is arranged around the furnace, has superconducting coils, and generates a magnetic field distribution. A magnetic flux density distribution on an X axis, which is a direction of magnetic force lines at the central axis in a horizontal plane, is a convex upward distribution, and a magnetic flux density on the X axis becomes 80% or less of a magnetic flux density set value at a crucible wall. Simultaneously, a magnetic flux density distribution on a Y axis, orthogonal to the X axis, is a convex downward distribution, and a magnetic flux density on the Y axis becomes 140% or more of the set value at the crucible wall when the magnetic flux density at the central axis in the horizontal plane is the set value.

2 Claims, 20 Drawing Sheets

(51) Int. Cl.
  *C30B 29/06* (2006.01)
  *C30B 15/14* (2006.01)
  *C30B 30/04* (2006.01)
  *H01F 6/04* (2006.01)
  *H01F 6/06* (2006.01)
  *C30B 29/42* (2006.01)

(52) U.S. Cl.
  CPC ............... *C30B 30/04* (2013.01); *H01F 6/04* (2013.01); *H01F 6/06* (2013.01); *C30B 29/42* (2013.01)

(56) References Cited

U.S. PATENT DOCUMENTS

| | | |
|---|---|---|
| 2009/0183670 A1 | 7/2009 | Cho et al. |
| 2014/0053771 A1 | 2/2014 | Walter et al. |

FOREIGN PATENT DOCUMENTS

| | | |
|---|---|---|
| JP | 2005-123313 A | 5/2005 |
| JP | 2009-173536 A | 8/2009 |

OTHER PUBLICATIONS

Nov. 8, 2016 International Search Report issued in International Patent Application No. PCT/JP2016/003827.

Jul. 17, 2018 Notification of Reasons for Refusal issued in Japanese Patent Application No. 2015-185654.

100deg

110deg

140deg

SINGLE-CRYSTAL PULLING APPARATUS AND SINGLE-CRYSTAL PULLING METHOD

TECHNICAL FIELD

The present invention relates to a single-crystal pulling apparatus and a single-crystal pulling method using the same.

BACKGROUND ART

Each of semiconductors such as silicon or gallium arsenic is constituted of a single crystal and is used for memories and the like of small to large computers, and an increase in capacity, a reduction in cost, and improvement in quality of memory devices have been demanded.

As one of single-crystal pulling methods for manufacturing single crystals which meet these demands of the semiconductors, there has been conventionally known a method for manufacturing a semiconductor having a large diameter and high quality by applying a magnetic field to a molten semiconductor material contained in a crucible and thereby inhibiting heat convection produced in a melt (which is generally referred to as a magnetic Czochralski (MCZ) method).

An example of a single-crystal pulling apparatus using the conventional CZ method will now be described with reference to FIG. 10. A single-crystal pulling apparatus 100 in FIG. 10 includes a pulling furnace 101 having an openable/closeable upper surface, and includes a crucible 102 in this pulling furnace 101. Further, a heater 103 for heating and melting a semiconductor material in the crucible 102 is provided around the crucible 102 in the pulling furnace 101, and a superconducting magnet 130 having a pair of superconducting coils 104 (104a and 104b) incorporated in a refrigerant container 105 as a cylindrical container (which will be referred to as a cylindrical refrigerant container hereinafter) is arranged on an outer side of the pulling furnace 101.

At the time of manufacturing single crystals, a semiconductor material 106 is put in the crucible 102 and heated by the heater 103, and the semiconductor material 106 is molten. A non-illustrated seed crystal is moved down and inserted into this melt from above, e.g., a central portion of the crucible 102, and the seed crystal is pulled in a pulling direction 108 at a predetermined velocity by a non-illustrated pulling mechanism. Consequently, a crystal grows in a solid and liquid boundary layer, and a single crystal is generated. At this time, when fluid motion of the melt induced by heating of the heater 103, i.e., the heat convection is produced, a dislocation of the single crystal to be pulled is apt to occur, and a yield rate of single-crystal production is lowered.

Thus, as a countermeasure, the superconducting coils 104 of the superconducting magnet 130 are used. That is, the semiconductor material 106 which is the melt undergoes motion suppressing power by lines of magnetic force 107 produced by energization to the superconducting coils 104, the growing single crystal is slowly pulled upward with pulling of the seed crystal without producing the convection in the crucible 102, and the single crystal is manufactured as a solid single crystal 109. It is to be noted that, although not shown, the pulling mechanism for pulling the single crystal 109 along a crucible central axis 110 is provided above the pulling furnace 101.

Next, an example of the superconducting magnet 130 used in the single-crystal pulling apparatus 100 shown in FIG. 10 will now be described with reference to FIG. 11. This superconducting magnet 130 has the superconducting coils 104 (104a and 104b) contained in a cylindrical vacuum container 119 through the cylindrical refrigerant container. In this superconducting magnet 130, the pair of superconducting coils 104a and 104b facing each other through a central portion of the vacuum container 119 are accommodated. The pair of superconducting coils 104a and 104b are Helmholtz-type magnetic coils which generate magnetic fields parallel to the same lateral direction, and, as shown in FIG. 10, the axisymmetric lines of magnetic force 107 are generated to the central axis 110 of the pulling furnace 101 and the vacuum container 119 (a position of this central axis 110 is referred to as a magnetic field center).

It is to be noted that, as shown in FIGS. 10 and 11, this superconducting magnet 130 includes a current lead 111 through which a current is introduced to the two superconducting coils 104a and 104b, a small helium refrigerator 112 for cooling a first radiation shield 117 and a second radiation shield 118 contained in the cylindrical refrigerant container 105, a gas discharge pipe 113 through which a helium gas in the cylindrical refrigerant container 105 is discharged, a service port 114 having a replenishing port from which a liquid helium is replenished, and others. The pulling furnace shown in FIG. 10 is arranged in a bore 115 of such a superconducting magnet 130.

FIG. 12 shows a magnetic field distribution of the above-described conventional superconducting magnet 130. As shown in FIG. 11, in the conventional superconducting magnet 130, since the pair of superconducting coils 104a and 104b facing each other are arranged, a magnetic field gradually increases toward both sides in each coil arranging direction (an X direction in FIG. 12), and the magnetic field gradually decreases toward an up-and-down direction in a direction orthogonal to the former (a Y direction in FIG. 12). In such a conventional configuration, since a magnetic field gradient in the range of the bore 115 is too large as shown in FIG. 12, suppression of the heat convection produced in the molten single crystal material is unbalanced, and magnetic field efficiency is poor. That is, as indicated by hatched lines representing a region having the same magnetic flux density in FIG. 12, magnetic field uniformity is not good in a region near a central magnetic field and its vicinity (i.e., a cross shape which is elongate from right to left and up and down is formed in FIG. 12), and hence there arises a problem that a heat convection suppressing effect is low and a high-quality single crystal cannot be pulled.

To solve the problem, as shown in FIG. 13(a) and FIG. 13(b), Patent Document 1 discloses that the number of superconducting coils 104 is four or more (e.g., 104a, 104b, 104c, and 104d), these coils are arranged on planes in a cylindrical container concentrically provided around a pulling furnace, the respective arranged superconducting coils are set to directions in which they face each other through an axial center of the cylindrical container, and an arrangement angle θ (see FIG. 13(b)) at which each pair of superconducting coils adjacent to each other face the inner side of the cylindrical container is set to a range of 100 degrees to 130 degrees (i.e., a center angle α (see FIG. 13(b)) between coil axes of adjacent to each other with the X axis at the center is 50 degrees to 80 degrees). Consequently, a lateral magnetic field which has a reduced magnetic field gradient and excellent uniformity can be generated in a bore 115, a magnetic field distribution having a concentric shape or a square shape can be produced on a plane, unbalanced electromagnetic force can be greatly suppressed, thus a uniform magnetic field region in the pulling direction can be improved, a magnetic field in the lateral magnetic field direction becomes substantially horizontal, manufacture of a high-quality single crystal can be realized by suppression of the unbalanced electromagnetic force, and this patent Document also discloses that a high-quality single crystal can be pulled with a good yield rate by this single-crystal pulling method.

That is, in each magnetic field distribution shown in FIG. 14 to FIG. 18 showing the magnetic field distributions when the arrangement angle θ of the superconducting coils 104a, 104b, 104c, and 104d is set to 100 degrees, 110 degrees, 115 degrees, 120 degrees, and 130 degrees (i.e., the center angle α between the coil axes is 80 degrees, 70 degrees, 65 degrees, 60 degrees, and 50 degrees), a central magnetic field is uniformly arranged in a sufficiently large region. On the other hand, a width of the central magnetic field in the Y direction is extremely narrow when the arrangement angle θ is as small as 90 degrees (the center angle α between the coil axes is 90 degrees) as shown in FIG. 19, and the width of the central magnetic field in the X direction is extremely narrow when the arrangement angle θ is as large as 140 degrees (the center angle α between the coil axes is 40 degrees) as shown in FIG. 20.

Thus, in the superconducting magnet 130 in FIG. 13, when the arrangement angle θ is set in the range of 100 degrees to 130 degrees, a uniformly distributed magnetic field having a concentric shape or a square shape can be provided in the bore 115.

CITATION LIST

Patent Literature

Patent Document 1: Japanese Unexamined Patent Publication (Kokai) No. 2004-051475

DISCLOSURE OF INVENTION

Problem to be Solved by the Invention

However, as a result of conducting examinations by the present inventor, it has been revealed from comprehensive heat transfer analysis including three-dimensional melt convection that the heat convection differs depending on a cross section parallel to the X axis and a cross section vertical to the X axis even in a uniform magnetic field distribution as shown in FIG. 14 to FIG. 18 when the lines of magnetic force at the central axis 110 form a lateral magnetic field which extends toward the X axis direction.

FIG. 8 shows a result of analyzing a state where single-crystal pulling is performed by the conventional technology using two coils shown in FIGS. 10 and 11, a left side in the drawing shows a flow velocity distribution in a cross section parallel to a direction of the lines of magnetic force (i.e., the X axis) at the central axis 110, and a right side shows a flow velocity distribution in a cross section vertical to the X axis (i.e., a cross section parallel to the Y axis). When the magnetic field is applied to the molten semiconductor material in this manner, the convection is suppressed, and there is almost no flow in a lower half of the molten semiconductor material in particular, but a flow field remains in an upper half. In a case where a conducting fluid moves in a magnetic field, an induced current is produced in a direction orthogonal to lines of magnetic force and a velocity component vertical to the lines of magnetic force, but a crucible wall and a free surface of the molten semiconductor material become an insulating wall when a quartz crucible having electrically insulating properties is used, and hence the induced current does not flow in the direction orthogonal to these members. Thus, convection suppressing force provided by electromagnetic force is weak in an upper portion of the molten semiconductor material, and comparing the left side (the cross section parallel to the X axis) with the right side (the cross section vertical to the X axis) in FIG. 8 reveals that the convection is more strong in the cross section vertical to the X axis (the cross section vertical to the lines of magnetic force) than in the cross section parallel to the X axis (the cross section parallel to the lines of magnetic force).

On the other hand, in FIG. 9 shows a result of analyzing a state where the single-crystal pulling is performed by the technology disclosed in Patent Document 1 in which the uniform magnetic field distribution is formed by the four coils shown in FIG. 13 (where the center angle α between the coil axes is 60°), a flow velocity difference between the left side (the cross section parallel to the X axis) and the right side (the cross section vertical to the X axis) is slightly small as compared with FIG. 8, but a flow velocity distribution which is non-uniform in a circumferential direction of the crucible is provided.

Here, the analysis results shown in FIGS. 8 and 9 are obtained by performing simulation analysis to a state where pulling is carried out under the following single-crystal pulling conditions with the use of FEMAG-TMF as analysis software.

Crucible used: diameter of 800 mm
Charge amount of a single-crystal material: 400 kg
Single crystal to be grown: diameter of 306 mm
Length of a straight body portion of a single crystal: 40 cm
Magnetic flux density: adjusted to provide 3000 G at the central axis 110 in a horizontal plane including the coil axes
Single-crystal rotational velocity: 6 rpm
Crucible rotational velocity: 0.03 rpm It is to be noted that the velocities shown in FIGS. 8 and 9 are velocities in the cross section, and a velocity in the circumferential direction is excluded.

As can be seen in FIGS. 8 and 9, in the conventional technology and the technology disclosed in Patent Document 1, since the flow field from the crucible wall to a growth interface remains in the cross section vertical to the X axis, oxygen eluting from the quartz crucible reaches the crystal, and hence there is a problem that an oxygen concentration reducing effect provided by application of a horizontal magnetic field has a limit and a need for extremely low oxygen concentration in semiconductor crystals for power devices or image sensors which have high demand recently is hard to be met. Further, presence of the flow field which is non-uniform in the circumferential direction of the crucible can cause growth striations in the single crystal which is pulled while rotating the same, and a resistivity/oxygen concentration fluctuation in a crystal rotation period is observed when the cross section parallel to a growth direction is evaluated, and hence there is also a problem that a ring-shaped distribution is provided in a wafer plane sliced in a direction vertical to the growth direction.

In view of the above-described problem, it is an object of the present invention to provide a single-crystal pulling apparatus and a single-crystal pulling method which can reduce oxygen concentration in a single crystal to be grown and suppress growth striations in the single crystal to be grown.

Means for Solving Problem

To achieve the above-described object, the present invention provides a single-crystal pulling apparatus including: a pulling furnace in which a heating heater and a crucible containing a molten single crystal material therein are arranged, and which has a central axis; and a magnetic field generation device which is arranged around the pulling furnace and has superconducting coils, the apparatus applying a horizontal magnetic field to the molten single crystal material by energization to the superconducting coils to suppress convection of the molten single crystal material in the crucible, wherein the magnetic field generation device generates a magnetic field distribution in such a manner that a magnetic flux density distribution on an X axis is a distribution which is convex upward when a direction of lines of magnetic force at the central axis in a horizontal plane including coil axes of the superconducting coils is determined as the X axis, and that a magnetic flux density on the X axis becomes 80% or less of a magnetic flux density set value at a crucible wall, at the same time that a magnetic flux density distribution on a Y axis which is orthogonal to the X axis and runs through the central axis in the horizontal plane is a distribution which is convex downward, and a magnetic flux density on the Y axis becomes 140% or more of the magnetic flux density set value at the crucible wall when the magnetic flux density at the central axis in the horizontal plane is determined as the magnetic flux density set value.

When the magnetic field generation device of the single-crystal pulling apparatus is configured to generate such a magnetic field distribution as described above, a flow velocity of the molten single crystal material can be reduced even in the cross section vertical to the X axis which has insufficient convectional suppressing force provided by electromagnetic force, and a flow velocity of the molten single crystal material in the cross section parallel to the X axis can be balanced with a flow velocity of the molten single crystal material in the cross section vertical to the X axis. When the flow velocity of the molten single crystal material is reduced even in the cross section vertical to the X axis, a time required for oxygen eluting from a crucible wall to reach the single crystal is prolonged, and it is possible to provide the single-crystal pulling apparatus which can greatly reduce oxygen concentration which is taken into the single crystal by increasing an oxygen evaporation amount from a free surface of the molten single crystal material. Furthermore, it is possible to provide the single-crystal pulling apparatus which can suppress the growth striations in the single crystal to be grown by balancing the flow velocity of the molten single crystal material in the cross section parallel to the X axis with the flow velocity of the molten single crystal material in the cross section vertical to the X axis.

At this time, in the magnetic field generation device, two pairs of superconducting coils arranged to face each other are provided in such a manner that respective coil axes thereof are included in the same horizontal plane, and a center angle $\alpha$ having the X axis sandwiched between the coils axes is set to 90 degrees or more and 120 degrees or less.

When the superconducting coils of the magnetic field generation device are arranged in this manner, such a magnetic field distribution as described above can be assuredly generated.

Moreover, the present invention provides a single-crystal pulling method including pulling a semiconductor single crystal by using the above-described single-crystal pulling apparatus.

According to such a single-crystal pulling method, concentration of oxygen to be taken in can be greatly reduced, and a semiconductor single crystal with suppressed growth striations can be grown.

Effect of the Invention

As described above, according to the single-crystal pulling apparatus of the present invention, the single-crystal pulling apparatus which can greatly reduce the concentration of the oxygen which is taken into the single crystal and can suppress the growth striations in the single crystal to be grown, can be provided. Additionally, according to the single-crystal pulling method of the present invention, the concentration of the oxygen to be taken in can be greatly reduced, and the single crystal with suppressed growth striations can be grown.

BEST MODE(S) FOR CARRYING OUT THE INVENTION

Figure 1:
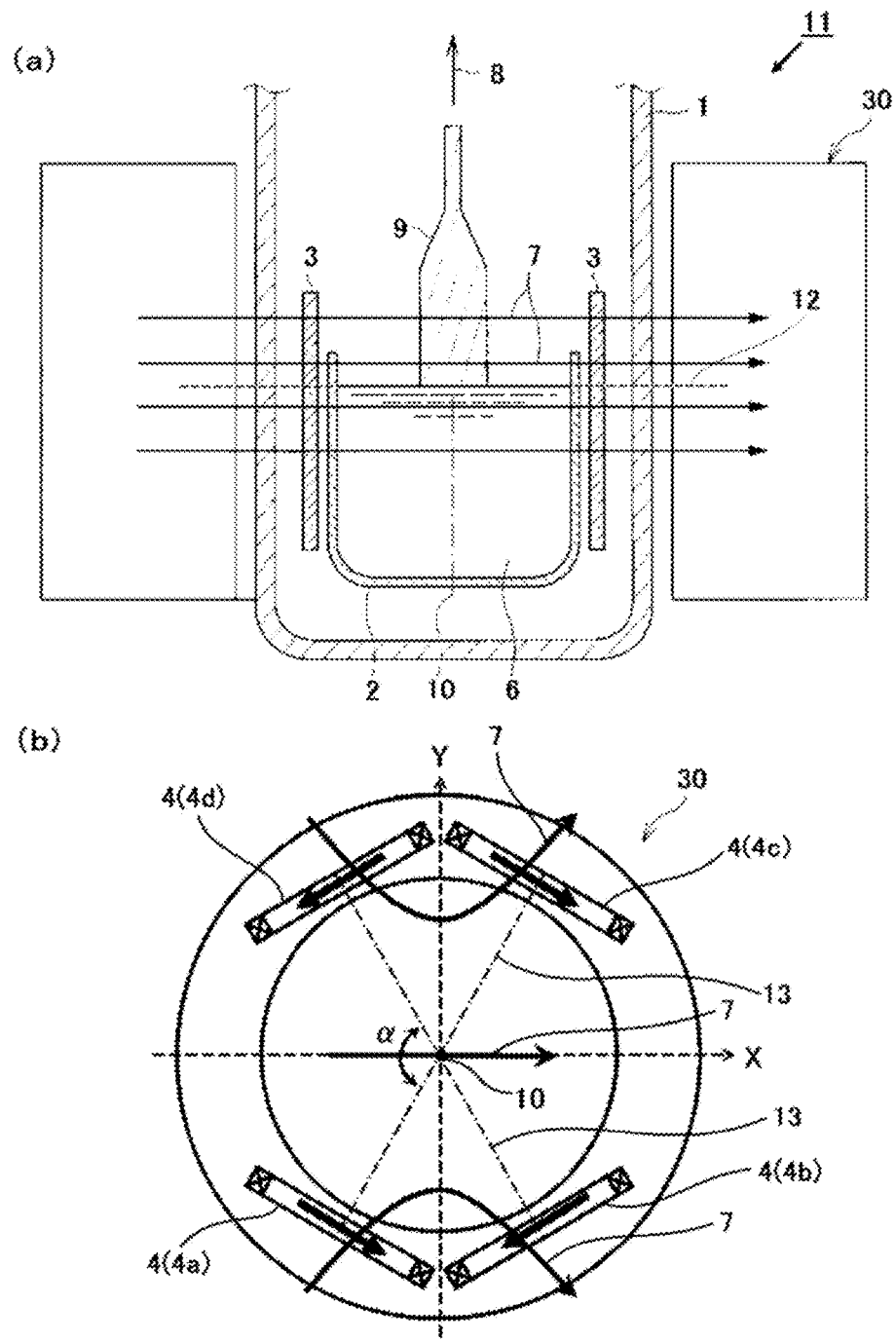
FIG. 1 are views showing an example of a single-crystal pulling apparatus of the present invention.

Although the present invention will now be described hereinafter as an embodiment with reference to the drawings, the present invention is not restricted thereto.

As described above, in Patent Document 1, setting the arrangement angle θ in the range of 100 degrees to 130 degrees (i.e., the center angle α between the coil axes is 50 degrees to 80 degrees) enables forming the uniformly distributed magnetic field having a concentric shape or a square shape in the bore. However, the comprehensive heat transfer analysis including three-dimensional melt convection conducted by the present inventor has revealed that, even in such a uniform magnetic field distribution, the heat convection differs depending on the cross section parallel to the X axis and the cross section vertical to the X axis in the lateral magnetic field in which the lines of magnetic force at the central axis 110 extends toward the X axis direction. When the flow field from the crucible wall to the growth interface remains in the cross section vertical to the X axis, since the oxygen eluting from the quartz crucible reaches the crystal, there arises the problem that the oxygen concentration reducing effect provided by the application of the horizontal magnetic field has a limit and a need for extremely low oxygen concentration in semiconductor single crystals for power devices or image sensors is hard to be met. Further, presence of the flow field which is non-uniform in the circumferential direction of the crucible can cause growth striations in the single crystal which is pulled while rotating the same, and a resistivity/oxygen concentration fluctuation in the crystal rotation period is observed when the cross section parallel to a growth direction is evaluated, and hence there is also a problem that a ring-shaped distribution is provided in a wafer plane sliced in a direction vertical to the growth direction.

Thus, the present inventor has repeatedly conducted the earnest studies on a single-crystal pulling apparatus which can reduce oxygen concentration in a single crystal to be grown and suppress the growth striations in the single crystal to be grown.

As a result, the present inventor has decided to generate a magnetic field distribution in such a manner that a magnetic flux density distribution on an X axis is a distribution which is convex upward when a direction of lines of magnetic force at a central axis in a horizontal plane including coil axes of superconducting coils is determined as the X axis, and that the magnetic flux density becomes 80% or less of a magnetic flux density set value at a crucible wall, at the same time that a magnetic flux density distribution on a Y axis which is orthogonal to the X axis and runs through the central axis in the horizontal plane is a distribution which is convex downward, and a magnetic flux density on the Y axis becomes 140% or more of the magnetic flux density set value at the crucible wall when a magnetic flux density at the central axis in the horizontal plane is determined as the magnetic flux density set value. The present inventor has found out that by generating a magnetic field distribution as described above it is possible to provide a single-crystal pulling apparatus which can reduce a flow velocity of a molten single crystal material even in a cross section vertical to the X axis where convection suppressing force provided by electromagnetic force is insufficient, balance the flow velocity of the molten single crystal material in the cross section parallel to the X axis with the flow velocity of the molten single crystal material in the cross-section vertical to the X axis to prolong a time required for oxygen eluting from the crucible wall to reach a single crystal, thus reduce oxygen concentration in the single crystal to be grown by an increase in oxygen evaporation amount from a free surface of the molten single crystal material, and suppress growth striations in the single crystal to be grown, thereby bringing the present invention to completion.

First, an embodiment of the single-crystal pulling apparatus of the present invention will be described with reference to FIG. 1.

The single-crystal pulling apparatus 11 in FIG. 1 includes a pulling furnace 1 in which a heating heater 3 and a crucible 2 containing a molten single crystal material (which will be referred to as a melt hereinafter) 6 are arranged therein and which has a central axis 10, and a magnetic field generation device 30 which is provided around the pulling furnace 1 and has superconducting coils, a horizontal magnetic field is applied to the melt 6 by energization to the superconducting coils, and a single crystal 9 is pulled in a pulling direction 8 while suppressing convection of the melt 6 in the crucible 2.

The magnetic field generation device 30 generates a magnetic field distribution in such a manner that a magnetic flux density distribution on an X axis is a distribution which is convex upward when a direction of lines of magnetic force 7 at the central axis 10 in a horizontal plane 12 including coil axes of the superconducting coils is determined as the X axis, and that the magnetic flux density on the X axis becomes 80% or less of a magnetic flux density set value at a crucible wall, at the same time that a magnetic flux density distribution on a Y axis which is orthogonal to the X axis and runs through the central axis 10 in the horizontal plane is a distribution which is convex downward, and magnetic flux density on the Y axis becomes 140% or more of the magnetic flux density set value at the crucible wall when the magnetic flux density at the central axis 10 in the horizontal plane 12 is determined as the magnetic flux density set value.

When the magnetic field generation device 30 of the single-crystal pulling apparatus 11 is configured to generate such a magnetic field distribution as described above, a flow velocity of the melt 6 can be reduced even in the cross section vertical to the X axis where convection suppressing force provided by electromagnetic force is insufficient, and the flow velocity of the melt 6 in the cross section parallel to the X axis can be balanced with the flow velocity of the melt 6 in the cross section vertical to the X axis. It is possible to provide the single-crystal pulling apparatus which prolongs a time required for oxygen eluting from a crucible wall to reach a single crystal by reducing the flow velocity of the molten single crystal material even in the cross section vertical to the X axis, and can greatly reduce concentration of the oxygen which is taken into the single crystal by an increase in oxygen evaporation amount from a free surface of the melt 6. Further, it is also possible to provide the single-crystal pulling apparatus which can suppress growth striations in the single crystal 9 to be grown by balancing the flow velocity of the melt 6 in the cross section parallel to the X axis with the flow velocity of the melt 6 in the cross section vertical to the X axis.

For example, as shown in FIG. 1(b) which is a view showing the magnetic field generation device 30 when seen from above, the magnetic field generation device 30 which generates such a magnetic field distribution as described above can be configured to have coil arrangement in which two pairs (i.e., a pair of 4(a) and 4(c) and a pair of 4(b) and 4(d)) of superconducting coils 4 arranged to face each other are provided to be included in the same horizontal plane 12 (see FIG. 1(a)) and each center angle α having the X axis sandwiched between coil axes 13 is set to 90 degrees or more and 120 degrees or less.

Setting the center angle α to 90 degrees or more enables assuredly producing the above-described magnetic field distribution, and setting the center angle α to 120 degrees or less enables arranging the superconducting coils without bringing the superconducting coils adjacent to each other into contact with each other even though a coil diameter is not reduced.

As a matter of course, the coils are not restricted to the two pairs as long as the above-described magnetic field distribution is produced, and one pair, three pairs, or more can be adopted.

An embodiment of a single-crystal pulling method of the present invention will now be described with reference to FIG. 1.

The single-crystal pulling method of the present invention is configured to pull the semiconductor single crystal 9 by using the single-crystal pulling apparatus 11 in FIG. 1 described above.

Specifically, the semiconductor single crystal 9 is pulled as described below.

First, in the single-crystal pulling apparatus 11, a semiconductor material is put into the crucible 2 and heated by the heating heater 3 to melt the semiconductor material (see FIG. 1(a)).

Then, a horizontal magnetic field generated by the magnetic field generation device 30 is applied to the molten semiconductor single crystal material (i.e., the melt) 6 by energization to the superconducting coils, and convection of the melt 6 in the crucible 2 is suppressed (see FIG. 1(a)). At this time, the magnetic field distribution is generated in such a manner that a magnetic flux density on the X axis is a distribution which is convex upward when the direction of lines of magnetic force 7 at the central axis 10 in the horizontal plane 12 including the coil axes of the superconducting coils is determined as the X axis, and that a magnetic flux density on the X axis becomes 80% or less of a magnetic flux density set value at the crucible wall, at the same time that a magnetic flux density distribution on the Y axis which is orthogonal to the X axis and runs through the central axis 10 in the horizontal plane is a distribution which is convex downward, and a magnetic flux density on the Y axis becomes 140% or more of the magnetic flux density set value at the crucible wall when a magnetic flux density on the central axis 10 in the horizontal plane 12 is determined as the magnetic flux density set value (see FIG. 1(a)). As the magnetic field generation device 30 which generates such a magnetic field distribution as described above, it is possible to use a magnetic field generation device having coil arrangement in which two pairs of superconducting coils 4 arranged to face each other are provided in such a manner that the respective coil axes 13 are included in the same horizontal plane and the center angle α having the X axis sandwiched between the coil axes 13 is set to 90 degrees or more and 120 degrees or less.

In this case, although a lower limit value of the magnetic flux density on the crucible wall on the X axis and an upper limit value of the magnetic flux density on the crucible wall on the Y axis are not restricted in particular, in general, the magnetic flux density on the crucible wall on the X axis becomes 30% or more of the magnetic flux density set value and the magnetic flux density on the crucible wall on the Y axis becomes 250% or less of the magnetic flux density set value for the convenience of the apparatus.

Then, a seed crystal (not shown) is moved down and inserted into the melt 6 from, e.g., above a central portion of the crucible 2, the seed crystal is pulled by a pulling mechanism (not shown) at a predetermined velocity, and it is pulled in the pulling direction 8 while being rotated (see FIG. 1(a)). Consequently, a crystal grows in a solid and liquid boundary layer, and the semiconductor single crystal 9 is produced.

According to such a single-crystal pulling method, it is possible to grow the semiconductor single crystal in which concentration of oxygen to be taken in is greatly reduced and growth striations are suppressed.

EXAMPLES

The present invention will now be more specifically described hereinafter with reference to Examples and Comparative Examples, but the present invention is not restricted thereto.

Example 1

Figure 2:
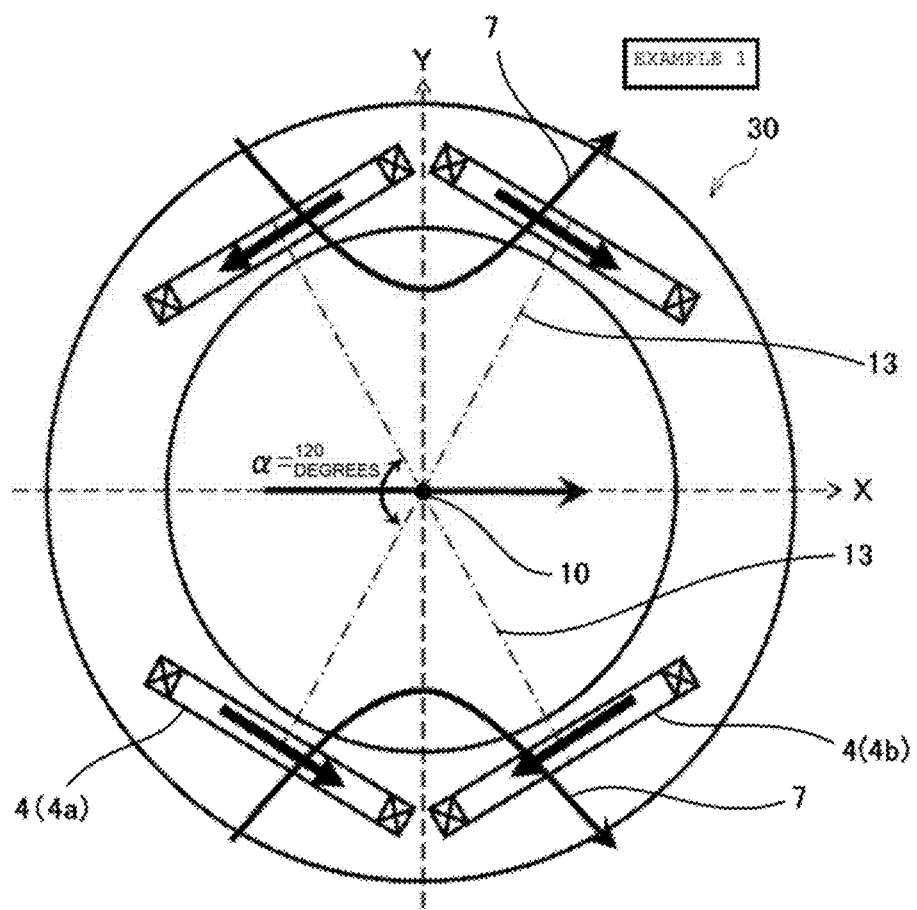
FIG. 2 is a view showing coil arrangement (a view seen from above) of Example 1.

The single-crystal pulling apparatus 11 in FIG. 1(a) was configured to adopt a magnetic field generation device having coil arrangement shown in FIG. 2 (i.e., the center angle α between coil axes is 120 degrees) as the magnetic field generation device 30.

A semiconductor single crystal was pulled by using such a single-crystal pulling apparatus under the following pulling conditions.

Figure 4:
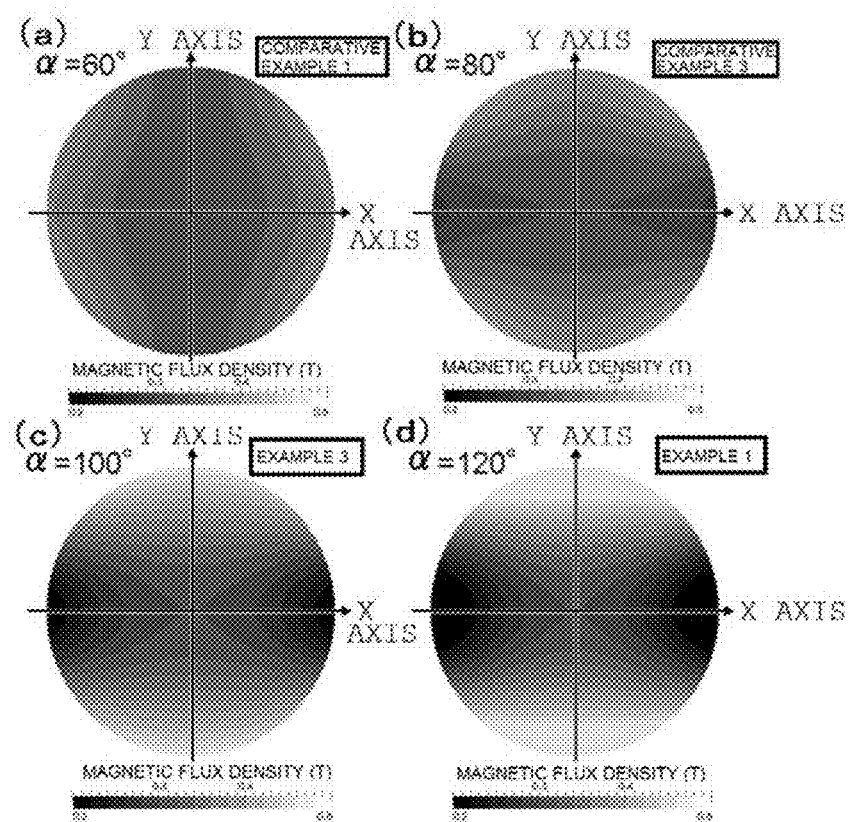
FIG. 4 are views showing magnetic flux density portions in Example 1, Example 3, Comparative Example 1, and Comparative Example 3.
Figure 5:
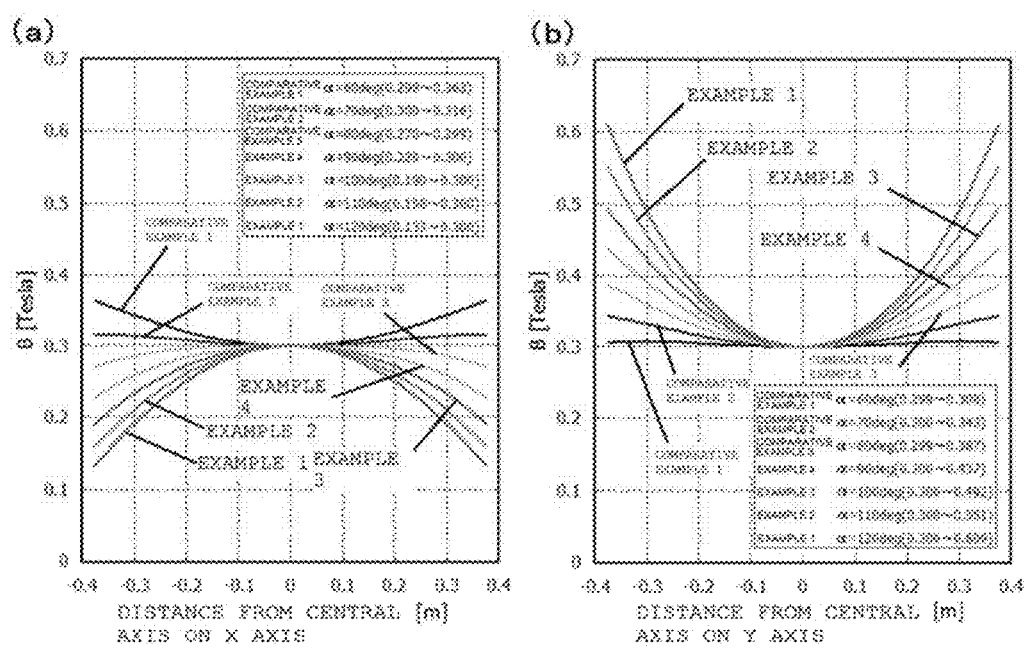
FIG. 5 are views each showing a magnetic flux density distribution in a plane including coil axes.

Crucible used: diameter of 800 mm
Charge amount of a single-crystal material: 400 kg
Single crystal to be grown: diameter of 306 mm
Magnetic flux density: adjusted to provide 3000 G (a magnetic flux density set value) at the central axis 10 in a horizontal plane including the coil axes
Single-crystal rotational velocity: 6 rpm
Crucible rotational velocity: 0.03 rpm A magnetic flux density distribution in the horizontal plane including the coil axes in this example was measured. FIG. 4(d), FIG. 5, and Table 1 show results. Here, FIG. 5(a) shows a magnetic flux density distribution on an X axis, and FIG. 5(b) shows a magnetic flux density distribution on a Y axis. In Example 1, the magnetic flux density distribution on the X axis is a distribution which is convex upward (see FIG. 5(a), and the magnetic flux on the X axis is 80% or less (44%) of a magnetic flux density set value at a crucible wall (see Table 1). Furthermore, in Example 1, the magnetic flux density distribution on the Y axis is a distribution which is convex downward (see FIG. 5(b)), and the magnetic flux density on the Y axis 140% or more (203%) of the magnetic flux density set value at the crucible wall (see Table 1).

Moreover, by using FEMAG-TMF as analysis software, simulation analysis was performed to a flow velocity distribution of a melt 6 on each cross section (a cross section on the X axis and a cross section on the Y axis) in a state where a length of a straight body portion of the single crystal became 40 cm when the single crystal was pulled under the above-described pulling conditions. FIG. 6(d) shows an analysis result.

Figure 7:
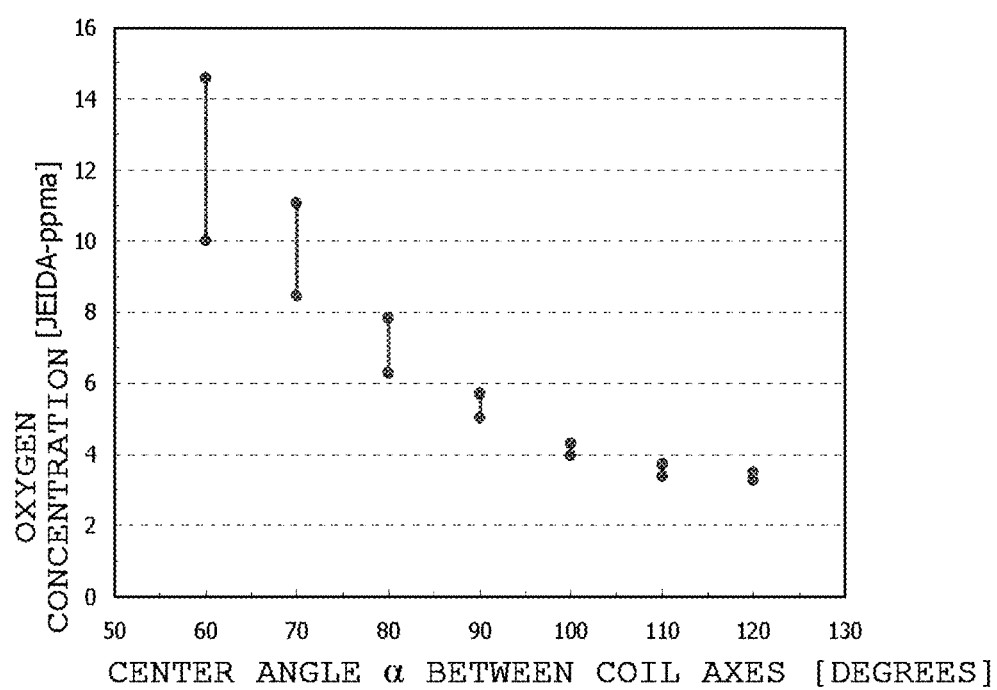
FIG. 7 is a graph showing a relationship between a center angle $\alpha$ between coil axes and oxygen concentration in a single crystal.
Figure 8:
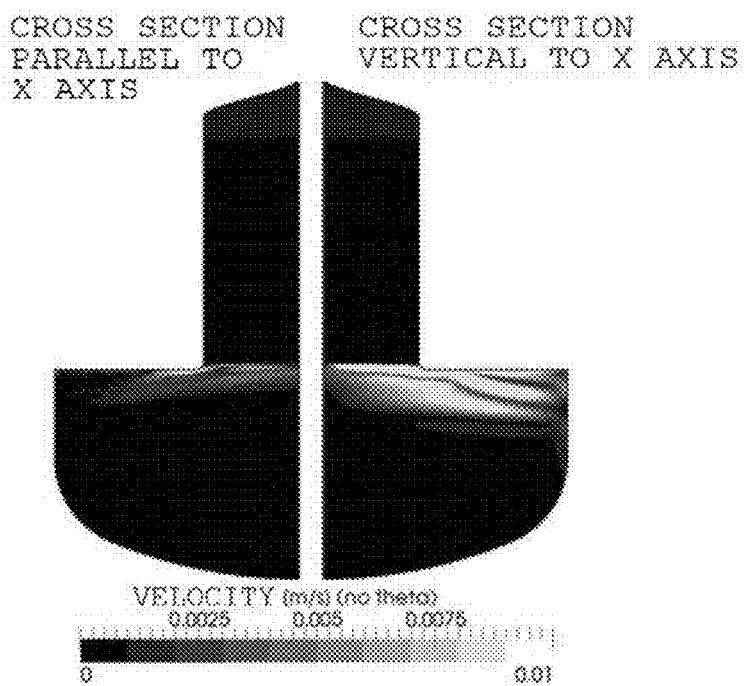
FIG. 8 is a view showing a flow velocity distribution in a melt cross section when a superconducting magnet (two coils) of a conventional technology is used.
Figure 9:
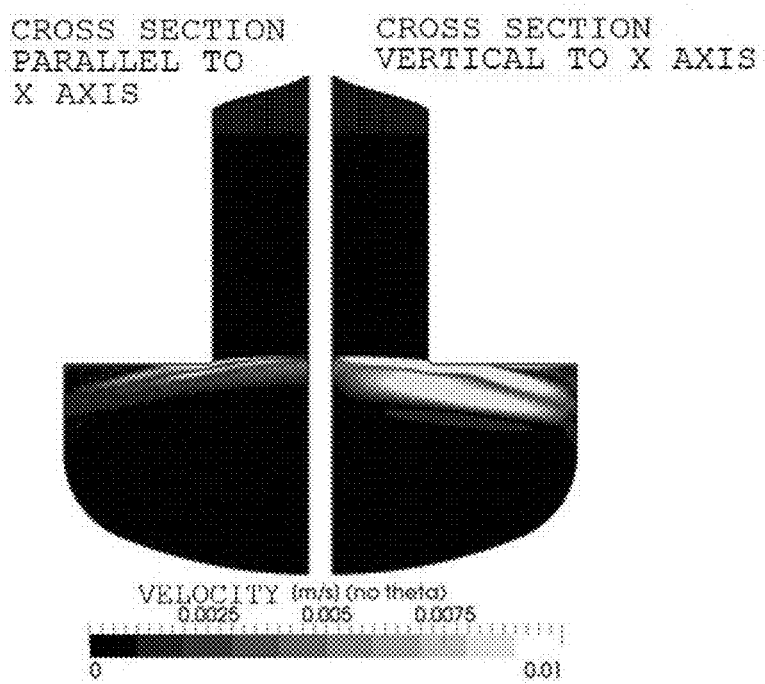
FIG. 9 is a view showing a flow velocity distribution in a melt cross section when a superconducting magnet (four coils) of Patent Document 1 is used.
Figure 10:
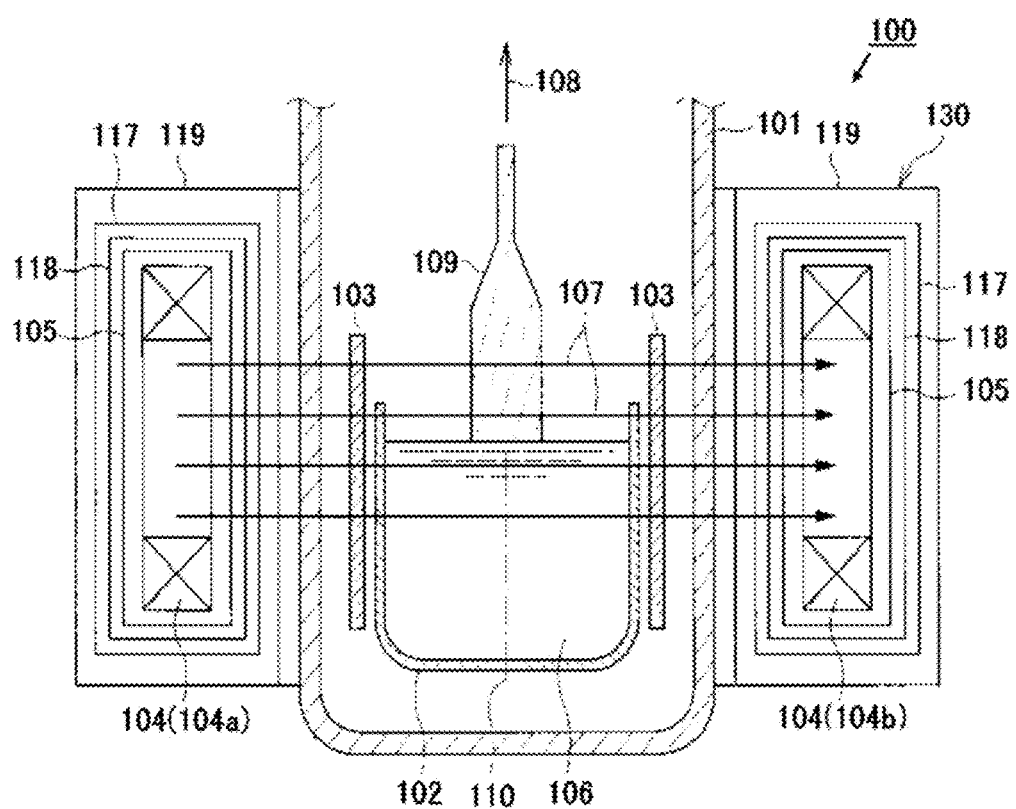
FIG. 10 is a schematic cross-sectional view showing an example of a conventional single-crystal pulling apparatus.
Figure 11:
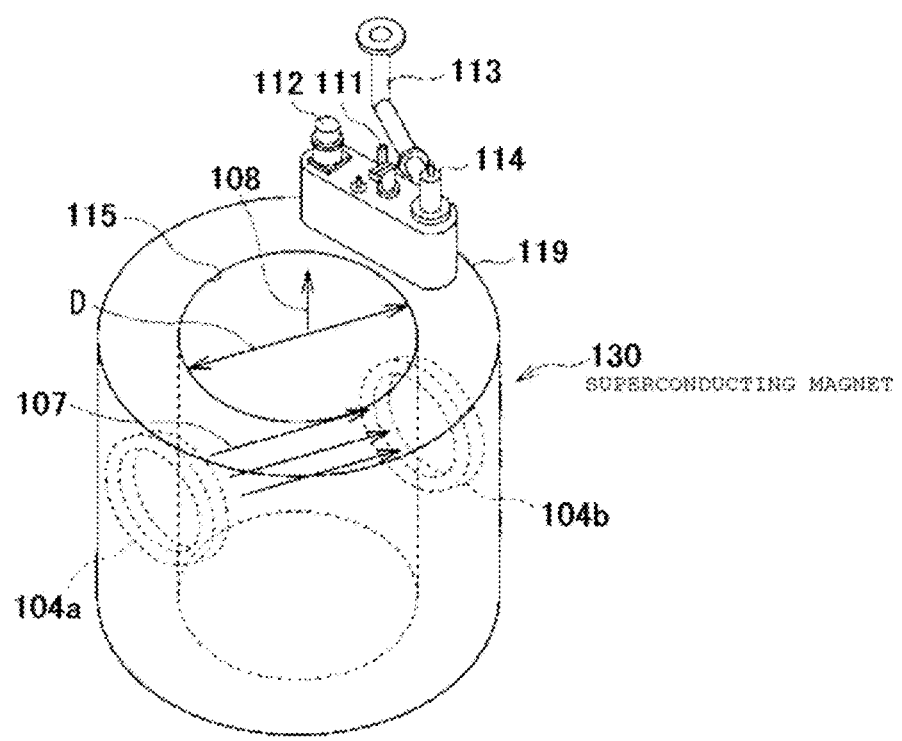
FIG. 11 is a schematic perspective view showing an example of a superconducting magnet.
Figure 12:
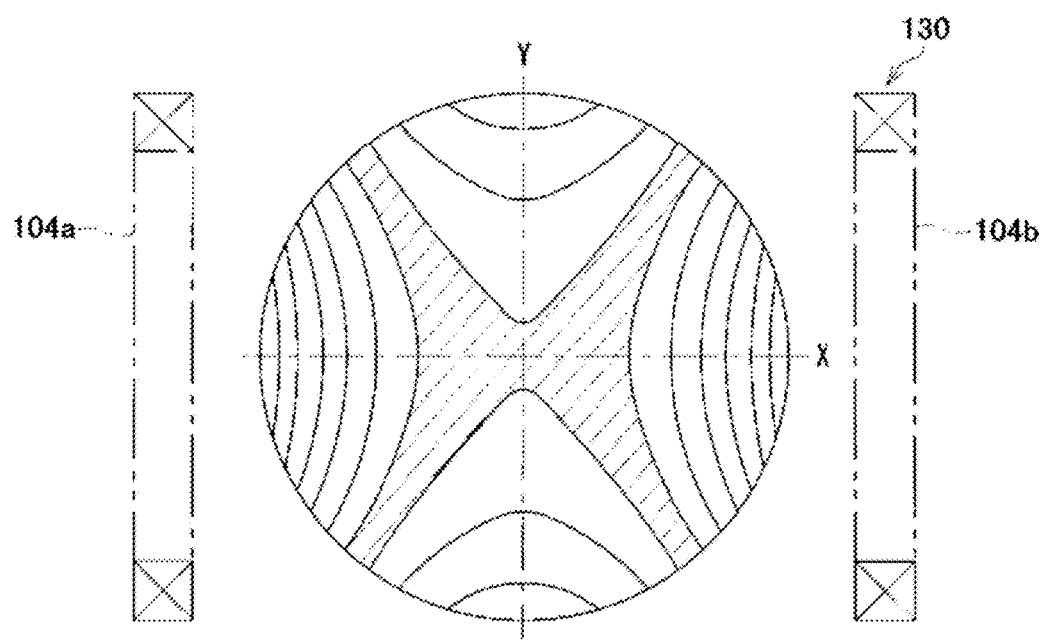
FIG. 12 is a view showing a conventional magnetic flux density distribution.
Figure 13:
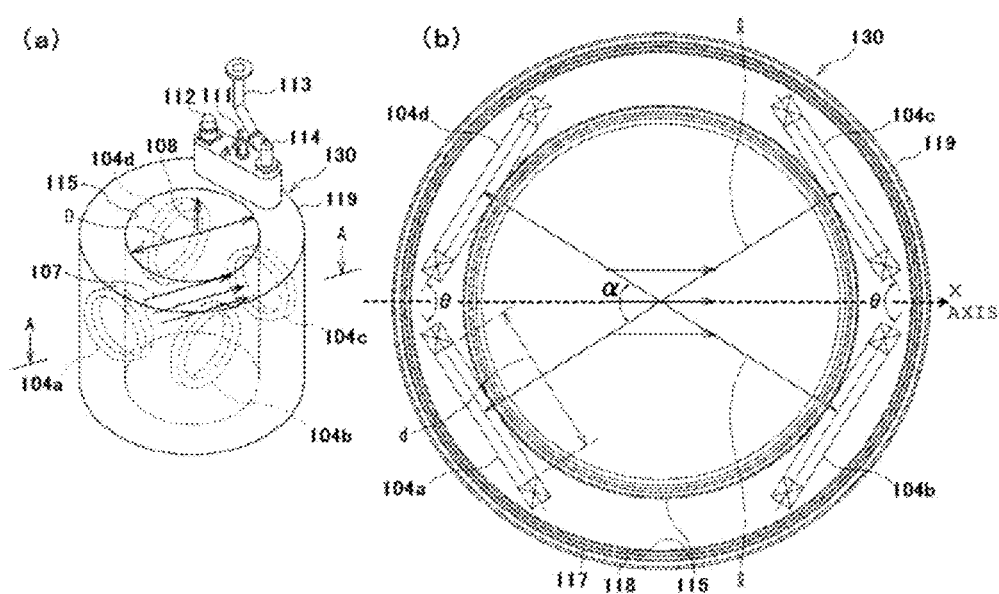
FIG. 13 are schematic perspective view and a schematic transverse cross-sectional view showing a superconducting magnet in Patent Document 1.
Figure 14:
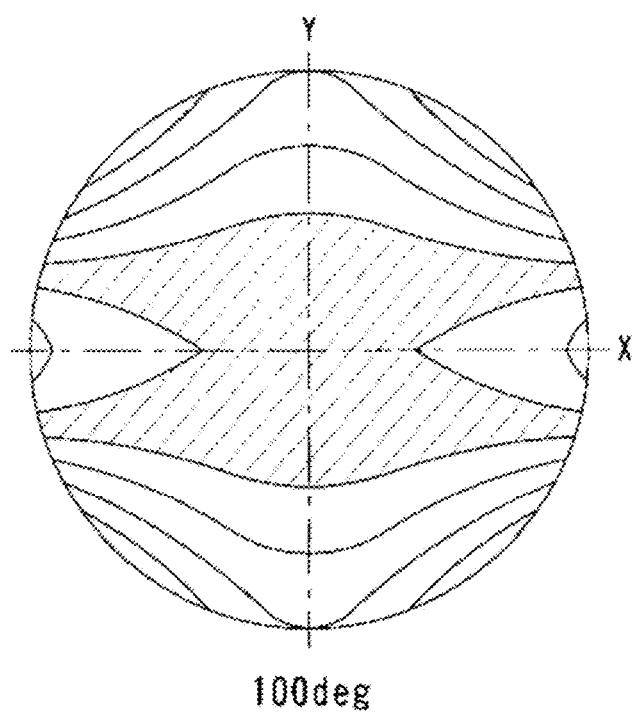
FIG. 14 is a view showing a magnetic flux density distribution when an arrangement angle $\theta=100$ degrees in FIG. 13.
Figure 15:
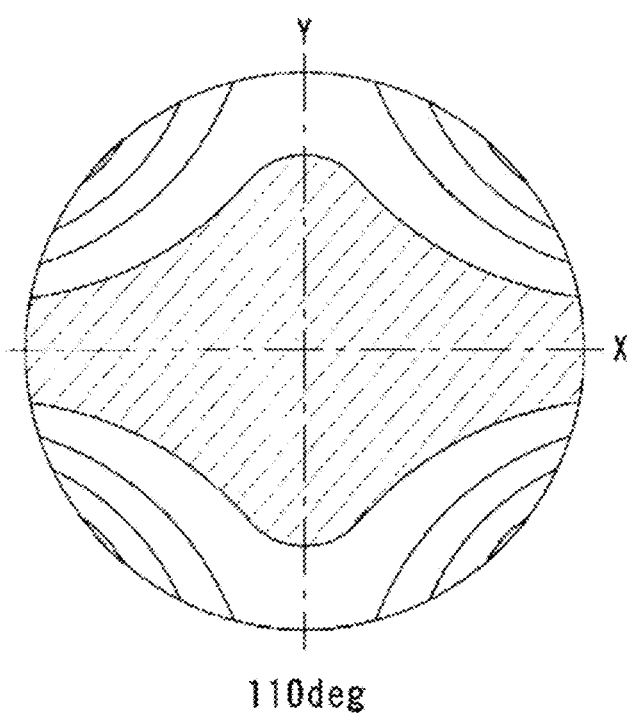
FIG. 15 is a view showing a magnetic flux density distribution when the arrangement angle $\theta=110$ degrees in FIG. 13.
Figure 16:
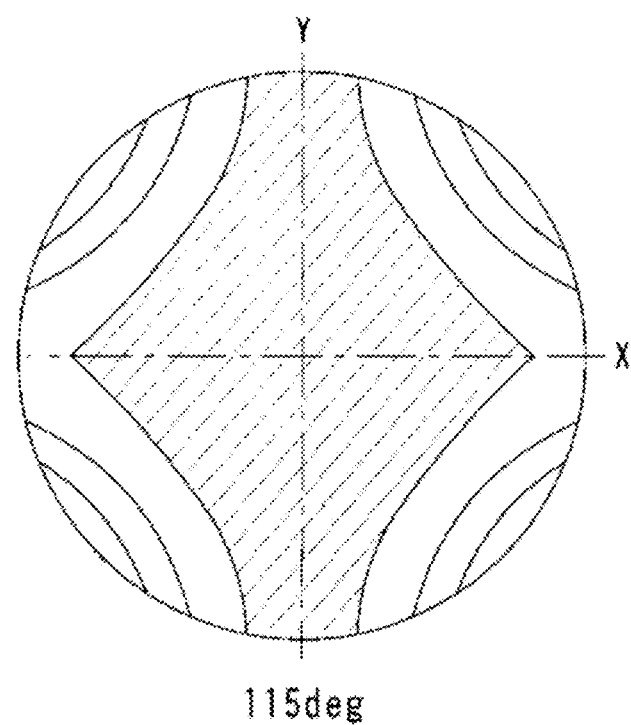
FIG. 16 is a view showing a magnetic flux density distribution when the arrangement angle $\theta=115$ degrees in FIG. 13.
Figure 17:
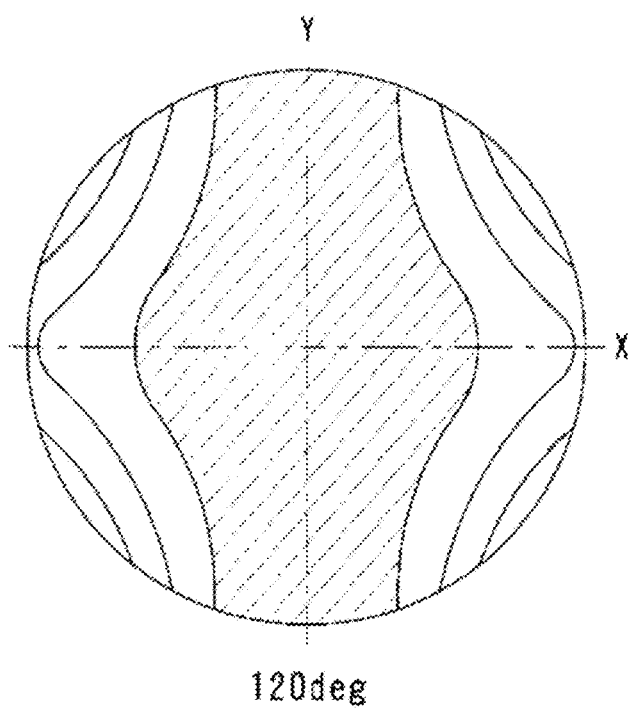
FIG. 17 is a view showing a magnetic flux density distribution when the arrangement angle θ=120 degrees in FIG. 13.
Figure 18:
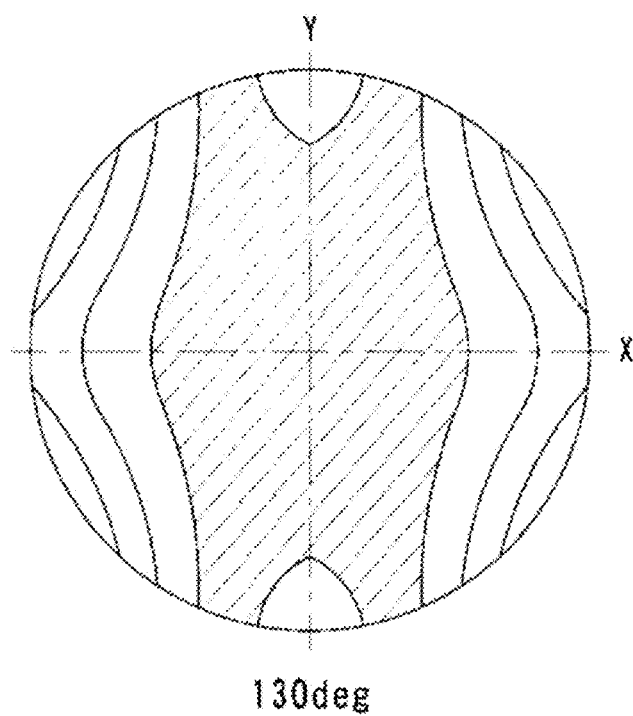
FIG. 18 is a view showing a magnetic flux density distribution when the arrangement angle θ=130 degrees in FIG. 13.
Figure 19:
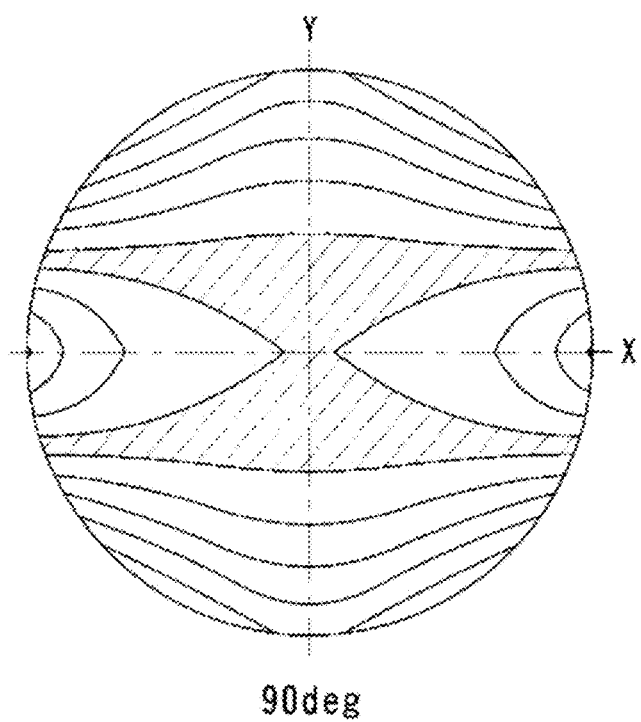
FIG. 19 is a view showing a magnetic flux density distribution when the arrangement angle θ=90 degrees in FIG. 13.
Figure 20:
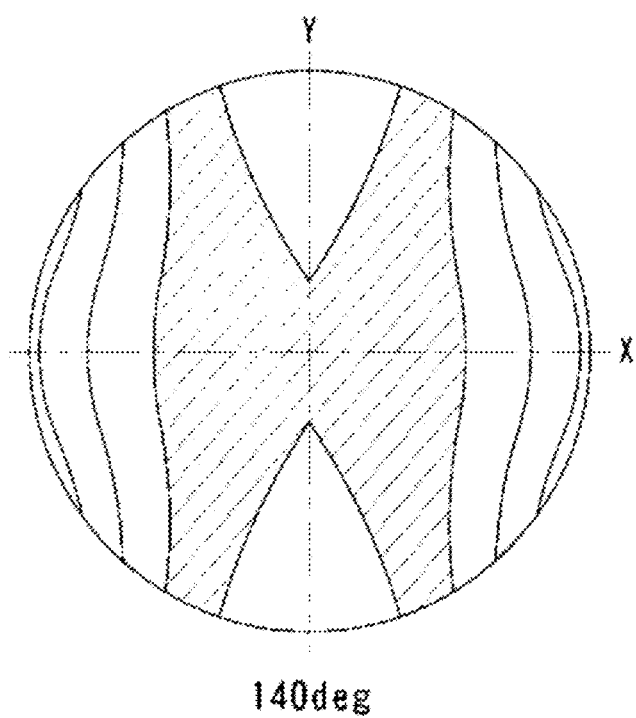
FIG. 20 is a view showing a magnetic flux density distribution when the arrangement angle θ=140 degrees in FIG. 13.

Oxygen concentration of the semiconductor single crystal grown in this manner was checked. FIG. 7 shows a result. Here, FIG. 7 shows a maximum value and a minimum vale of the oxygen concentration in each semiconductor single crystal and thus shows variations of the oxygen concentration in each semiconductor single crystal.

Example 2

A single-crystal pulling apparatus having the same structure as that of Example 1 was used except that the center angle α between the coil axes was set to 110 degrees.

A semiconductor single crystal was pulled by using such a single-crystal pulling apparatus in the same manner as Example 1.

A magnetic flux density distribution in a horizontal plane including coil axes in this example was measured. FIG. 5 and Table 1 show results. In Example 2, the magnetic flux density distribution on an X axis is a distribution which is convex upward (see FIG. 5(a)), and the magnetic flux density on the X axis is 80% or less (52%) of a magnetic flux density set value at a crucible wall (see Table 1). Additionally, in Example 2, the magnetic flux density distribution on a Y axis is a distribution which is convex downward (see FIG. 5(b)), and the magnetic flux density on the Y axis is 140% or more (183%) of the magnetic flux density set value at the crucible wall (see Table 1).

Oxygen concentration of the semiconductor single crystal grown in this manner was checked. FIG. 7 shows a result.

Example 3

A single-crystal pulling apparatus having the same structure as that of Example 1 was used except that the center angle α between the coil axes was set to 100 degrees.

A semiconductor single crystal was pulled by using such a single-crystal pulling apparatus in the same manner as Example 1.

A magnetic flux density distribution in a horizontal plane including coil axes in this example was measured. FIG. 4(c), FIG. 5, and Table 1 show results. In Example 3, the magnetic flux density distribution on an X axis is a distribution which is convex upward (see FIG. 5(a)), and the magnetic flux density on the X axis is 80% or less (63%) of a magnetic flux density set value at a crucible wall (see Table 1). Additionally, in Example 3, the magnetic flux density distribution on a Y axis is a distribution which is convex downward (see FIG. 5(b)), and the magnetic flux density on the Y axis is 140% or more (164%) of the magnetic flux density set value at the crucible wall (see Table 1).

Further, a flow velocity distribution of a melt 6 in the cross section was analyzed like Example 1. FIG. 6(c) shows an analysis result.

Oxygen concentration of the semiconductor single crystal grown in this manner was checked. FIG. 7 shows a result.

Example 4

A single-crystal pulling apparatus having the same structure as that of Example 1 was used except that the center angle α between the coil axes was set to 90 degrees.

A semiconductor single crystal was pulled by using such a single-crystal pulling apparatus in the same manner as Example 1.

A magnetic flux density distribution in a horizontal plane including coil axes in this example was measured. FIG. 5 and Table 1 show results. In Example 4, the magnetic flux density distribution on an X axis is a distribution which is convex upward (see FIG. 5(a)), and the magnetic flux density on the X axis is 80% or less (76%) of a magnetic flux density set value at a crucible wall (see Table 1). Additionally, in Example 4, the magnetic flux density distribution on a Y axis is a distribution which is convex downward (see FIG. 5(b)), and the magnetic flux density on the Y axis is 140% or more (145%) of the magnetic flux density set value at the crucible wall (see Table 1).

Oxygen concentration of the semiconductor single crystal grown in this manner was checked. FIG. 7 shows a result.

Comparative Example 1

Figure 3:
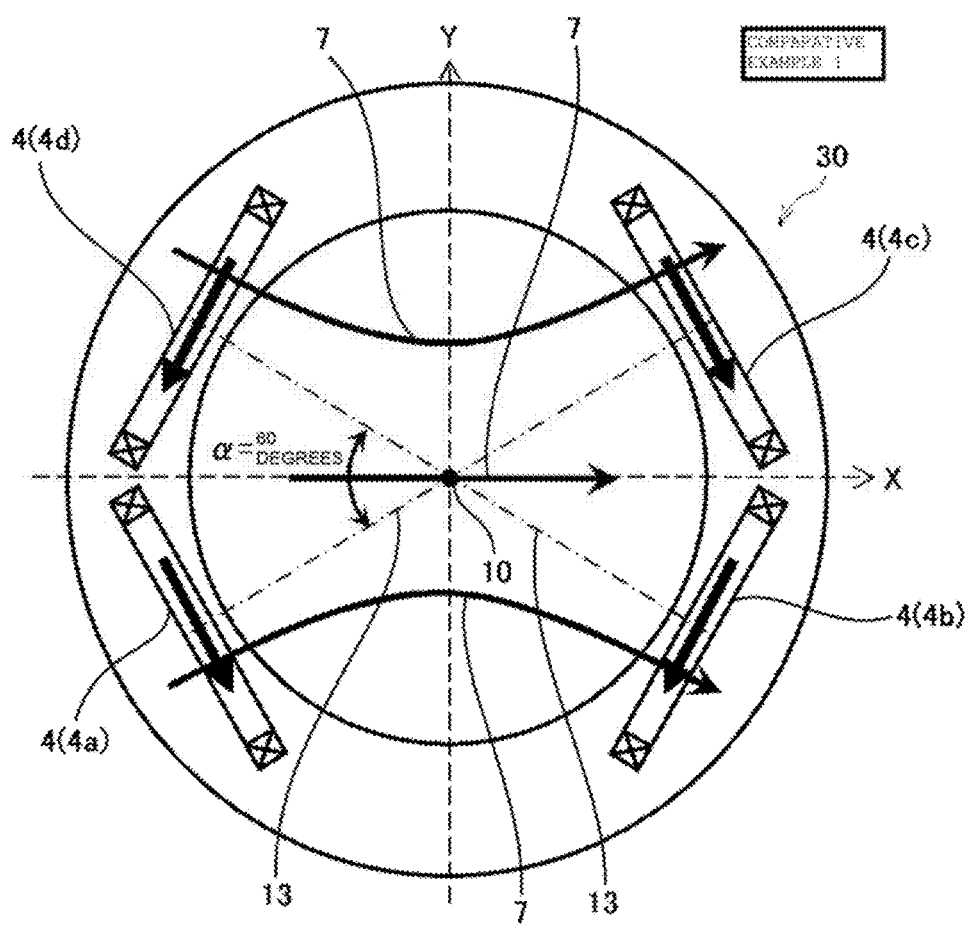
FIG. 3 is a view showing coil arrangement (a view seen from above) of Comparative Example 1.

The single-crystal pulling apparatus 11 in FIG. 1(a) was configured to adopt a magnetic field generation device having coil arrangement shown in FIG. 3 (i.e., the center angle α between coil axes is 60 degrees) as the magnetic field generation device 30.

A semiconductor single crystal was pulled by using such a single-crystal pulling apparatus in the same manner as Example 1.

A magnetic flux density distribution in a horizontal plane including coil axes in this example was measured. FIG. 4(a), FIG. 5, and Table 1 show results. In Comparative Example 1, the magnetic flux density distribution on an X axis is a distribution which is convex downward (see FIG. 5(a)), and the magnetic flux density on the X axis is larger than 80% (121%) of a magnetic flux density set value at a crucible wall (see Table 1). Additionally, in Comparative Example 1, the magnetic flux density distribution on a Y axis is substantially constant (see FIG. 5(b)), and the magnetic flux density on the Y axis is less than 140% (102%) of the magnetic flux density set value at the crucible wall (see Table 1).

Further, a flow velocity distribution of a melt 6 in the cross section was analyzed like Example 1. FIG. 6(a) shows an analysis result.

Oxygen concentration of the semiconductor single crystal grown in this manner was checked. FIG. 7 shows a result.

Comparative Example 2

A single-crystal pulling apparatus having the same structure as that of Comparative Example 1 was used except that the center angle α between the coil axes was set to 70 degrees.

A semiconductor single crystal was pulled by using such a single-crystal pulling apparatus in the same manner as Example 1.

A magnetic flux density distribution in a horizontal plane including coil axes in this example was measured. FIG. 5 and Table 1 show results. In Comparative Example 2, the magnetic flux density distribution on an X axis is a distribution which is convex downward (see FIG. 5(a)), and the magnetic flux density on the X axis is larger than 80% (105%) of a magnetic flux density set value at a crucible wall (see Table 1). Additionally, in Comparative Example 2, the magnetic flux density distribution on a Y axis is a distribution which is convex downward (see FIG. 5(b)), and the magnetic flux density on the Y axis is less than 140% (114%) of the magnetic flux density set value at the crucible wall (see Table 1).

Oxygen concentration of the semiconductor single crystal grown in this manner was checked. FIG. 7 shows a result.

Comparative Example 3

A single-crystal pulling apparatus having the same structure as that of Comparative Example 1 was used except that the center angle α between the coil axes was set to 80 degrees.

A semiconductor single crystal was pulled by using such a single-crystal pulling apparatus in the same manner as Example 1.

A magnetic flux density distribution in a horizontal plane including coil axes in this example was measured. FIG. 4(b), FIG. 5, and Table 1 show results. In Comparative Example 3, the magnetic flux density distribution on an X axis is a distribution which is convex upward (see FIG. 5(a)), and the magnetic flux density on the X axis is larger than 80% (90%) of a magnetic flux density set value at a crucible wall (see Table 1). Additionally, in Comparative Example 3, the magnetic flux density distribution on a Y axis is a distribution which is convex downward (see FIG. 5(b)), and the magnetic flux density on the Y axis is less than 140% (129%) of the magnetic flux density set value at the crucible wall (see Table 1).

Further, a flow velocity distribution of a melt 6 in the cross section was analyzed like Example 1. FIG. 6(b) shows an analysis result.

Oxygen concentration of the semiconductor single crystal grown in this manner was checked. FIG. 7 shows a result.

TABLE 1

|  | Center angle between coil axes [degrees] | Value on crucible wall on X axis [G] | Percentage to set value* [%] | Value on crucible wall on Y axis [G] | Percentage to set value* [%] |
|---|---|---|---|---|---|
| Comparative Example 1 | 60 | 3630 | 121 | 3080 | 102 |
| Comparative Example 2 | 70 | 3160 | 105 | 3430 | 114 |
| Comparative Example 3 | 80 | 2700 | 90 | 3870 | 129 |
| Example 1 | 120 | 1330 | 44 | 6090 | 203 |
| Example 2 | 110 | 1580 | 52 | 5510 | 183 |
| Example 3 | 100 | 1900 | 63 | 4920 | 164 |
| Example 4 | 90 | 2280 | 76 | 4370 | 145 |

*The set value is 3000 G

Figure 6:
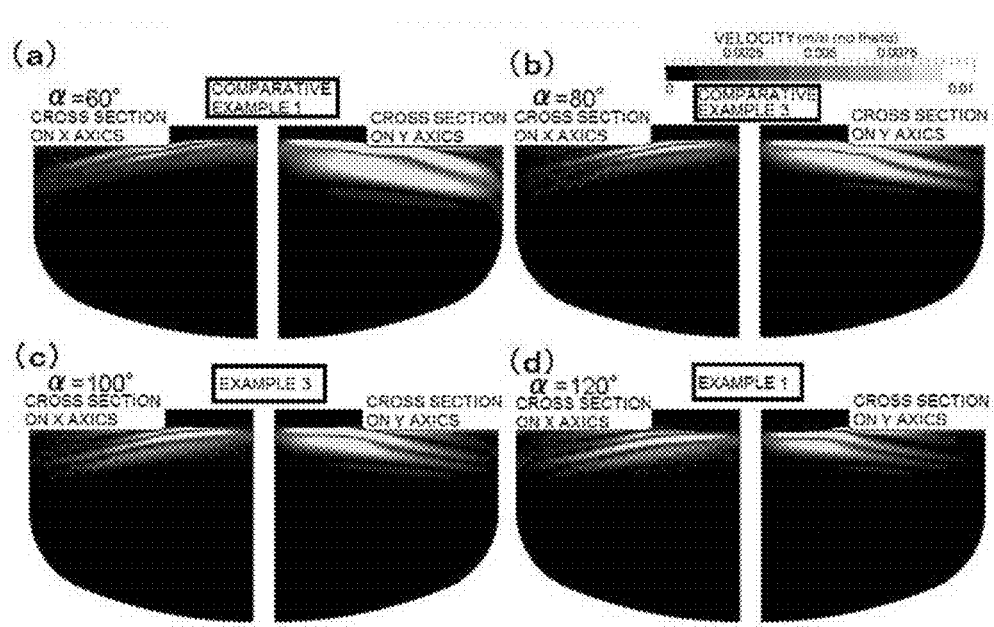
FIG. 6 are views each showing a flow velocity distribution in a melt cross section in Example 1, Example 3, Comparative Example 1, or Comparative Example 3.

As can be understood from FIG. 6, in Examples 1 and 3 where the magnetic flux density distribution on the X axis is the distribution which is convex upward, the magnetic flux density on the X axis is 80% or less of the magnetic flux density set value at the crucible wall, at the same time that the magnetic flux density distribution on the Y axis is the distribution which is convex downward, and the magnetic flux density on the Y axis is 140% or more of the magnetic flux density set value at the crucible wall, the flow velocity of the melt in the cross section on the Y axis is reduced and a difference between the flow velocity of the melt in the cross section on the X axis and the flow velocity of the melt in the cross section on the Y axis is reduced as compared with Comparative Examples 1 and 3 which do not meet the magnetic flux density distribution conditions.

Furthermore, as can be understood from FIG. 7, in Examples 1 to 4 which meet the above-described magnetic flux density distribution conditions, the oxygen concentration of the grown semiconductor single crystal is reduced and variations of the oxygen concentration are also reduced as compared with Comparative Examples 1 to 3 which do not meet above-described the magnetic flux density conditions.

Moreover, as can be understood from FIG. 5 and Table 1, setting the center angle α between the coil axes to 90 degrees or more and 120 degrees or less enables producing a magnetic field distribution which meets the magnetic flux density distribution conditions.

It is to be noted that the present invention is not restricted to the embodiment. The embodiment is just an illustrative example, and any example which has the same configuration and exerts the same functions and effects as the technical concept described in the scope of claims of the present invention is included in the technical scope of the present invention.

The invention claimed is:

1. A single-crystal pulling apparatus comprising: a pulling furnace in which a heating heater and a crucible containing a molten single crystal material therein are arranged, and which has a central axis; and a magnetic field generation device which is arranged around the pulling furnace and has superconducting coils, the apparatus applying a horizontal magnetic field to the molten single crystal material by energization to the superconducting coils to suppress convection of the molten single crystal material in the crucible, wherein the magnetic field generation device generates a magnetic field distribution in such a manner that a magnetic flux density distribution on an X axis is a distribution which is convex upward when a direction of lines of magnetic force at the central axis in a horizontal plane including coil axes of the superconducting coils is determined as the X axis, and that a magnetic flux density on the X axis becomes 80% or less of a magnetic flux density set value at a crucible wall, at the same time that a magnetic flux density distribution on a Y axis which is orthogonal to the X axis and runs through the central axis in the horizontal plane is a distribution which is convex downward, and a magnetic flux density on the Y axis becomes 140% or more of the magnetic flux density set value at the crucible wall when the magnetic flux density at the central axis in the horizontal plane is determined as the magnetic flux density set value, wherein, in the magnetic field generation device, two pairs of superconducting coils arranged to face each other are provided in such a manner that respective coil axes thereof are included in the same horizontal plane, and a center angle α having the X axis sandwiched between the coils axes is set to 100 degrees or more and 120 degrees or less.

2. A single-crystal pulling method, comprising: pulling a semiconductor single crystal by using a single-crystal pulling apparatus, the single-crystal pulling apparatus comprising:

a pulling furnace in which a heating heater and a crucible containing a molten single crystal material therein are arranged, and which has a central axis; and a magnetic field generation device which is arranged around the pulling furnace and has superconducting coils, the apparatus applying a horizontal magnetic field to the molten single crystal material by energization to the superconducting coils to suppress convection of the molten single crystal material in the crucible, wherein the magnetic field generation device generates a magnetic field distribution in such a manner that a magnetic flux density distribution on an X axis is a distribution which is convex upward when a direction of lines of magnetic force at the central axis in a horizontal plane including coil axes of the superconducting coils is determined as the X axis, and that a magnetic flux density on the X axis becomes 80% or less of a magnetic flux density set value at a crucible wall, at the same time that a magnetic flux density distribution on a Y axis which is orthogonal to the X axis and runs through the central axis in the horizontal plane is a distribution which is convex downward, and a magnetic flux density on the Y axis becomes 140% or more of the magnetic flux density set value at the crucible wall when the magnetic flux density at the central axis in the horizontal plane is determined as the magnetic flux density set value, wherein, in the magnetic field generation device, two pairs of superconducting coils arranged to face each other are provided in such a manner that respective coil axes thereof are included in the same horizontal plane, and a center angle $\alpha$ having the X axis sandwiched between the coils axes is set to 100 degrees or more and 120 degrees or less.

* * * * *